United States Patent
Ye (10) Patent No.: US 9,577,111 B2
(45) Date of Patent: Feb. 21, 2017

(54) METHOD OF FABRICATING THIN FILM TRANSISTOR

(71) Applicant: Au Optronics Corporation, Hsinchu (TW)

(72) Inventor: Jia-Hong Ye, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/938,818

(22) Filed: Nov. 11, 2015

(65) Prior Publication Data

US 2017/0025541 A1   Jan. 26, 2017

(30) Foreign Application Priority Data

Jul. 24, 2015 (TW) .............................. 104124039 A (51) Int. Cl.
*H01L 29/786* (2006.01)
*H01L 21/02* (2006.01)

(52) U.S. Cl.
CPC .... *H01L 29/7869* (2013.01); *H01L 21/02565* (2013.01); *H01L 21/02675* (2013.01)

(58) Field of Classification Search
CPC ....... H01L 29/04; H01L 29/66; H01L 29/786; H01L 29/66757; H01L 29/78696; H01L 29/78675; H01L 27/12; H01L 27/1277; H01L 27/1285; H01L 27/1296; H01L 27/1281; H01L 21/02672; H01L 29/7869; H01L 21/02565; H01L 21/02675
See application file for complete search history.

(56) References Cited

U.S. PATENT DOCUMENTS

| | | | | |
|---|---|---|---|---|
| 5,897,347 A | * | 4/1999 | Yamazaki | ........... H01L 21/2022 257/E21.134 |
| 6,452,213 B1 | * | 9/2002 | Kimura | ............... H01L 27/1296 257/66 |
| 8,865,529 B2 | | 10/2014 | Sugawara | |
| 8,890,165 B2 | | 11/2014 | Lee et al. | |
| 2004/0241921 A1 | * | 12/2004 | Yeh | ..................... H01L 21/2026 438/166 |

(Continued)

FOREIGN PATENT DOCUMENTS

| TW | I316264 | 10/2009 |
|---|---|---|
| TW | I415278 | 11/2013 |

OTHER PUBLICATIONS

Hsieh et al., "Infrared femtosecond laser annealing polycrystalline silicon," NDL Communications, Nov. 2004, pp. 36-39.

*Primary Examiner* — John C Ingham
*Assistant Examiner* — Gustavo Ramallo
(74) *Attorney, Agent, or Firm* — Jianq Chyun IP Office (57) ABSTRACT

A method of fabricating a thin film transistor including following steps is provided. Sequentially form a semiconductor layer, a metal layer and an auxiliary layer on a substrate. Perform a crystallization process to transform the semiconductor layer into an active layer after the metal layer and the auxiliary layer are disposed on the semiconductor layer. After the active layer is formed, pattern the metal layer to form a source and a drain. Form a gate insulator and a gate. The gate insulator is disposed between the gate and the source and drain.

11 Claims, 6 Drawing Sheets

(56) References Cited

U.S. PATENT DOCUMENTS

| | | | |
|---|---|---|---|
| 2011/0114961 A1* | 5/2011 | Lee | H01L 21/02532 |
| | | | 257/72 |
| 2012/0149147 A1* | 6/2012 | Yamazaki | H01L 21/28176 |
| | | | 438/104 |
| 2012/0319100 A1 | 12/2012 | Yoshioka et al. | |
| 2013/0009147 A1 | 1/2013 | Koyama et al. | |

* cited by examiner

METHOD OF FABRICATING THIN FILM TRANSISTOR

CROSS-REFERENCE TO RELATED APPLICATION

This application claims the priority benefit of Taiwan application serial no. 104124039, filed on Jul. 24, 2015. The entirety of the above-mentioned patent application is hereby incorporated by reference herein and made a part of this specification.

BACKGROUND

Field of the Invention

The method of fabricating an active device and more particularly, to a method of fabricating a thin film transistor.

Description of Related Art

With the rise of awareness of environment protection in recent years, flat display panels benefiting from characteristics, such as low power consumption, good space efficiency, no radiation, high-quality and so on, have become mainstream in the market. The commonly seen flat display panels include liquid crystal displays (LCDs), plasma displays, electroluminescent displays and so on.

Taking the currently most popular LCDs for example, an LCD is mainly composed of a pixel array substrate, a color filter substrate and a liquid crystal layer sandwiched therebetween. A thin film transistor is commonly used as a switching element of each pixel structure on the pixel array substrate in the related art, and the performance of the switching element depends on the quality of an active layer of the thin film transistor. The active layer (e.g., a metal oxide semiconductor layer) of the thin film transistor has an issue of being easily damaged by ambient vapor during a process of patterning a source and a drain, which is unfavorable for the quality of the thin film transistor. In order to improve the issue, in a method of fabricating the thin film transistor in the related art, an etching stopper layer is first formed on the active layer of the thin film transistor, and a metal layer on the etching stopper layer is then patterned to form a source and a drain of the thin film transistor. Thereby, no matter whether the source and the drain are patterned and formed by a wet or a dry etching process, the active layer of the thin film transistor can be prevented from being damaged by the etchant used in the wet etching process or the plasma used in the dry etching process. In addition, the etching stopper layer covers at least a portion of an area of the active layer, the vapor can less contact the active layer, so as to reduce the probability of the active layer in an amorphous state deteriorating into a conductor. However, the disposition of the etching stopper layer causes some issues, such as the reduction of an aperture ratio of the pixel array substrate and the increase of fabrication cost of the thin film transistor.

SUMMARY

The invention provides a thin film transistor with high quality and low cost.

According to an embodiment of the invention, a method of fabricating a thin film transistor is provided. A semiconductor layer, a metal layer and an auxiliary layer are sequentially formed on a substrate. A crystallization process is performed to transform the semiconductor layer into an active layer, where the metal layer and the auxiliary layer are disposed on the semiconductor layer. After the active layer is formed, the metal layer is patterned to form a source and a drain. A gate insulator and a gate are formed. The gate insulator is disposed between the gate and the source and drain.

To sum up, in the method of fabricating the thin film transistor according to one of the embodiments of the invention, the active layer having crystalline elements is formed by the crystallization process before the metal layer is patterned to form the source and the drain. With etching resistance characteristics of the crystalline elements, the active layer can be prevented from being damaged by etchant during the process of patterning the metal layer, such that the thin film transistor with high quality and low cost can be fabricated.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
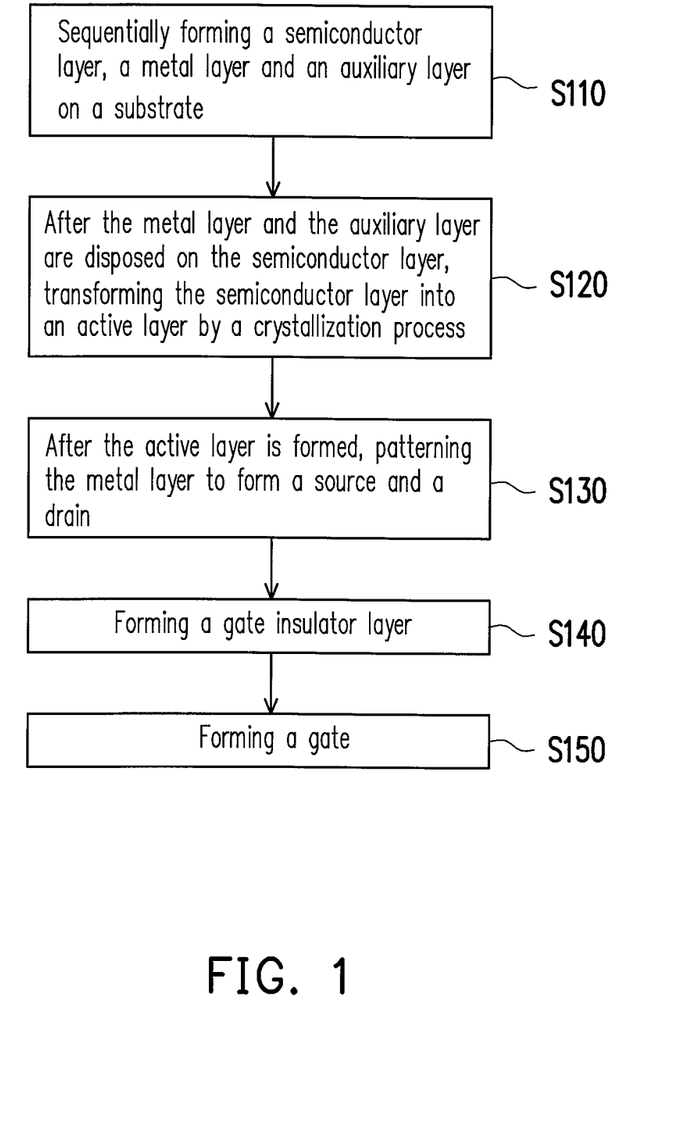
FIG. 1 is a schematic flowchart illustrating a method of fabricating a thin film transistor according to an embodiment of the invention.

FIG. 1 is a schematic flowchart illustrating a method of fabricating a thin film transistor according to an embodiment of the invention. Referring to FIG. 1, a method of fabricating a thin film transistor at least includes the following steps. Sequentially form a semiconductor layer, a metal layer and an auxiliary layer on a substrate (step S110). Material of the substrate may be PEN, PES or PI, for example. After the metal layer and the auxiliary layer are disposed on the semiconductor layer, transform the semiconductor layer into an active layer by a crystallization process (step S120). After the active layer is formed, pattern the metal layer to form a source and a drain (step S130). Form a gate insulator layer (S140). Form a gate (step S150). It should be mentioned that the sequence of steps S110 to S150 is not limited to that of steps S110, S120, S130, S140 and S150 illustrated in FIG. 1. The sequence of steps S110 to S150 may be adaptively changed. For example, the sequence may be steps S150, S140, S110, S120 and S130.

The method of fabricating the thin film transistor will be described in detail with reference to FIG. 2A to FIG. 2E and with reference to FIG. 4A to FIG. 4D.

Figure 2A:
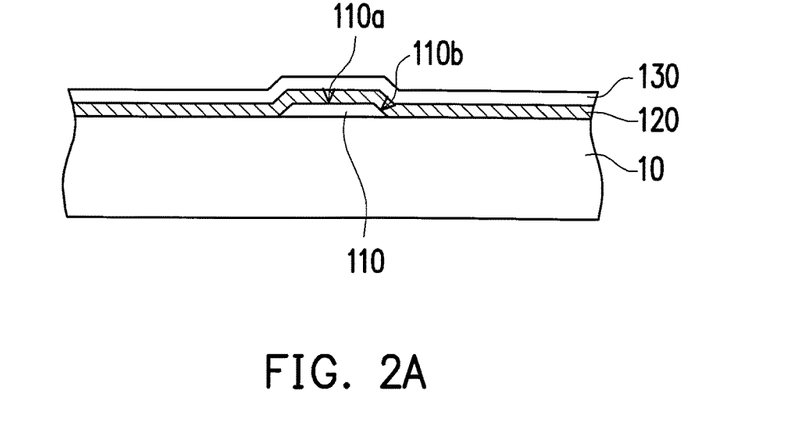
FIG. 2A to FIG. 2E are schematic cross-sectional views illustrating a method of fabricating a thin film transistor according to an embodiment of the invention.

FIG. 2A to FIG. 2E are schematic cross-sectional views illustrating a method of fabricating a thin film transistor according to an embodiment of the invention. Referring to FIG. 2A, in the present embodiment, a semiconductor layer 110, a metal layer 120 and an auxiliary layer 130 are first sequentially formed on a substrate 10. The semiconductor layer 110 may be a block, and the metal layer 120 and the auxiliary layer 130 may be a whole-surface film layer and cover a top surface 110a and a side wall 110b of the semiconductor layer 110. The substrate 10 may be a transparent substrate or a non-transparent/reflective substrate. The transparent substrate may be made of glass, quartz, organic polymer or any other suitable material. Organic polymer may be PEN, PES or PI, for example. The non-transparent/reflective substrate may be made of a conductive material, a wafer or any other suitable material.

In the present embodiment, the semiconductor layer 110 is, for example, a metal oxide semiconductor layer. Furthermore, a material of the metal oxide semiconductor may be an indium-containing metal oxide semiconductor material (e.g., indium-gallium-zinc oxide (IGZO), indium-zinc oxide (IZO), indium-tin oxide (ITO) or any other suitable material), a zinc-containing metal oxide semiconductor material (e.g., zinc oxide (ZnO), gallium-zinc oxide (GZO), zinc-tin oxide (ZTO) or any other suitable material), or a gallium-containing (Ga) metal oxide semiconductor material (e.g., indium-gallium-zinc oxide (IGZO) or any other suitable material). However, the invention is not intent to limit the material of the semiconductor layer 110 to the metal oxide semiconductor material. In other embodiments, the material of the semiconductor layer 110 may also be amorphous silicon, polysilicon, microcrystalline silicon, monocrystalline silicon, an organic semiconductor material or any other suitable material. The material of the metal layer 120 may be made of molybdenum (Mo), aluminum (Al), molybdenum wolfram (MoW), copper wolfram (CuW), another suitable material or a combination of two or more of the aforementioned materials. The auxiliary layer 130 may be made of amorphous silicon, polysilicon, monocrystalline silicon, another suitable material or a combination of two or more of the aforementioned materials.

Referring to FIG. 2A, then, a dehydrogenation process is performed on the auxiliary layer 130 and/or the metal layer 120 by selectively using a rapid thermal process (RTP) (not shown) to reduce a risk of hydrogen explosion. However, the invention is not limited thereto. In other embodiments, the dehydrogenation process may be performed in other ways, or the step of performing the dehydrogenation process is omitted.

Figure 2B:
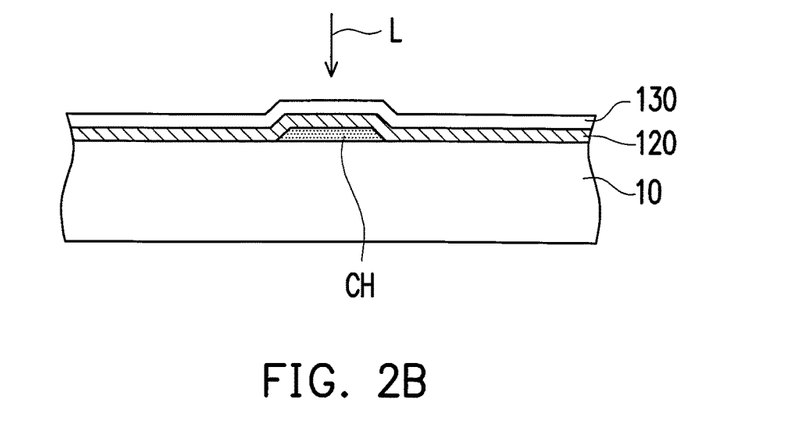

Referring to FIG. 2B, after the metal layer 120 and the auxiliary layer 130 are disposed on the semiconductor layer 110, a crystallization process is performed on the semiconductor layer 110, such that the semiconductor layer 110 is transformed into an active layer CH. For example, in the present embodiment, the semiconductor layer 110 may be transformed into the active layer CH by an excimer laser crystallization process. In detail, the auxiliary layer 130 may be irradiated by an excimer laser L. A light wavelength of the excimer laser L matches an absorption wavelength of the auxiliary layer 130. Thus, the auxiliary layer 130 absorbs the excimer laser L to generate thermal energy, where the thermal energy may be transmitted to the semiconductor layer 110 through the metal layer 120, such that the semiconductor layer 110 is crystallized to form the active layer CH. The metal layer 120 is in charge of not only transmitting the thermal energy, but also reducing a risk of peeling during the process of transforming the semiconductor layer 110 into the active layer CH. In the present embodiment, energy of the excimer laser L is, for example, greater than 70 mJ/cm$^2$, and the excimer laser crystallization process may be selectively performed under a temperature ranging from about 0° C. to about 25° C. However, the invention is not limited thereto, and in other embodiments, the semiconductor layer 110 may be crystallized by other suitable means (e.g., by the crystallization process using an infrared femtosecond laser or a green laser) to form the active layer CH.

Figure 3:
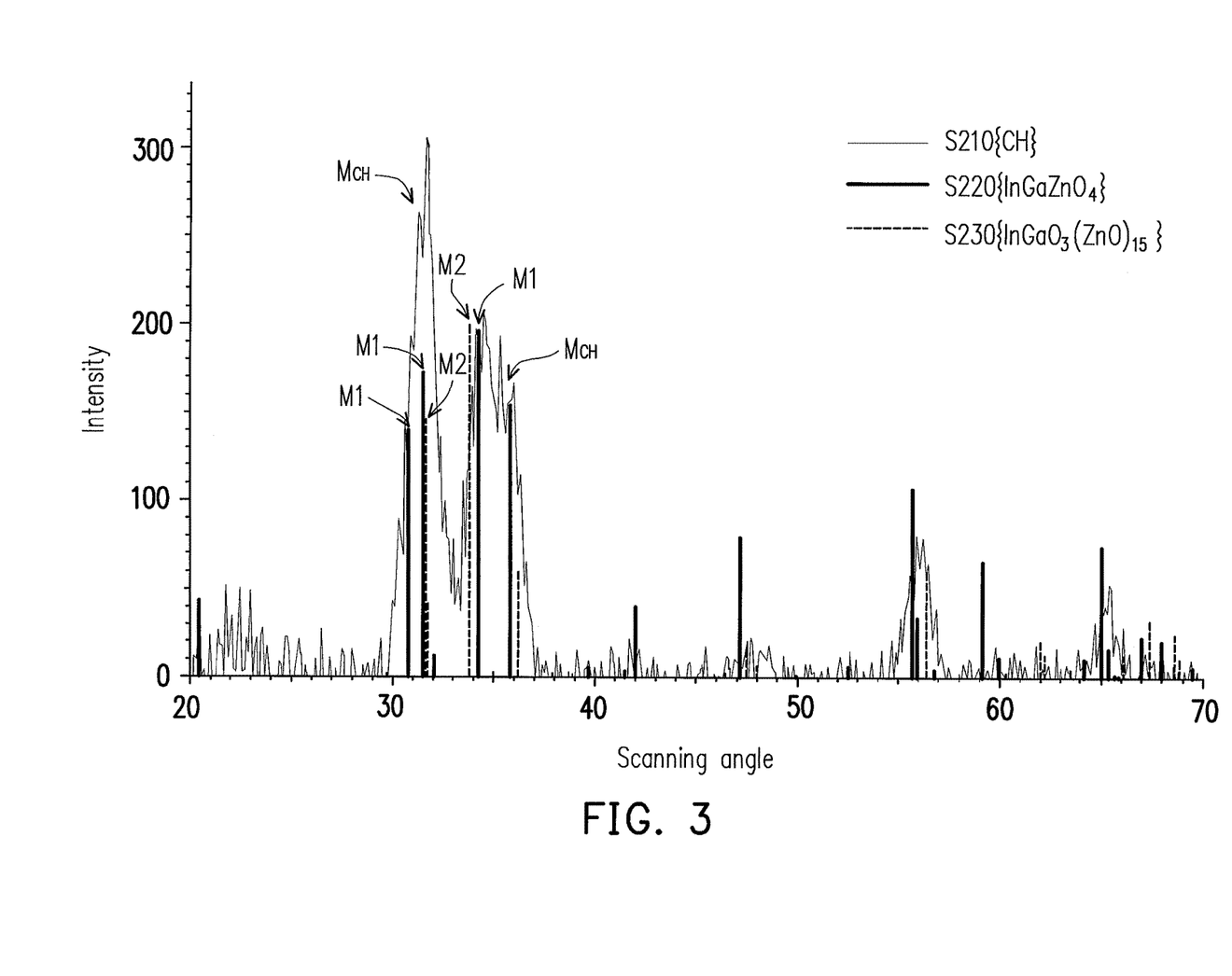
FIG. 3 illustrates an X-ray diffraction (XRD) spectrum of the active layer according to an embodiment of the invention.

The active layer CH formed by the crystallization process has crystalline elements, where FIG. 3 is taken as an example for evidencing. FIG. 3 illustrates an X-ray diffraction (XRD) spectrum of the active layer according to an embodiment of the invention. Referring to FIG. 3, a curve S210 represents an XRD spectrum of the active layer CH (including IGZO, for example) formed by the crystallization process, a curve S220 represents an XRD spectrum of InGaZnO$_4$, and a curve S230 represents an XRD spectrum of InGaO$_3$(ZnO)$_{15}$. By comparing the XRD spectrum of the active layer CH (i.e., the curve S210) with the XRD spectrum of InGaZnO$_4$ (i.e., the curve S220) and with the XRD spectrum of the InGaO$_3$(ZnO)$_{15}$ (i.e., the curve S230), a main distribution $M_{CH}$ of the XRD spectrum (i.e., the curve S210) of the active layer CH overlaps a main distribution M1 of the XRD spectrum (i.e., the curve S220) of the InGaZnO$_4$ and overlaps a main distribution M2 of the XRD spectrum (i.e., the curve S230) of the InGaO$_3$(ZnO)$_{15}$. Accordingly, the active layer CH has crystalline elements, such as InGaZnO$_4$ and InGaO$_3$(ZnO)$_{15}$, but the invention is not limited thereto.

Figure 2C:
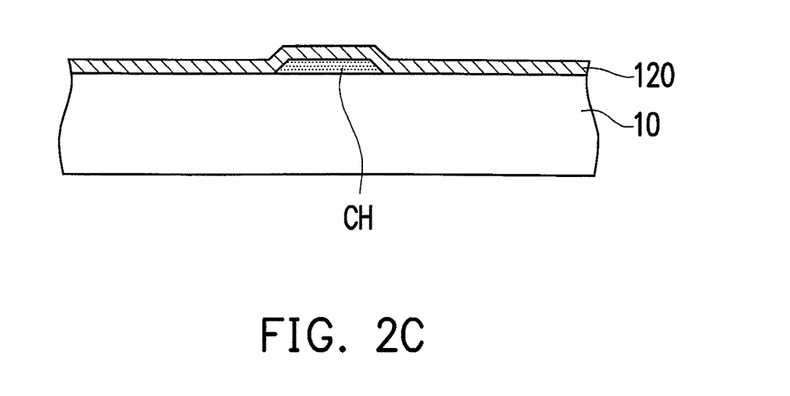

Referring to FIG. 2C, in the present embodiment, the auxiliary layer 130 may be selectively removed before patterning the metal layer 120. For example, in the present embodiment, the auxiliary layer 130 may be removed by a wet etching process, but the invention is not limited thereto. Additionally, it should be mentioned that the invention is not intent to limit to removing the auxiliary layer 130 before patterning the metal layer 120. In another embodiment of the invention, the metal layer 120 and the auxiliary layer 130 may be simultaneously patterned, and then, the patterned auxiliary layer (not shown) aligned with the patterned metal layer 120 (i.e., a source S and a drain D) is removed.

Figure 2D:
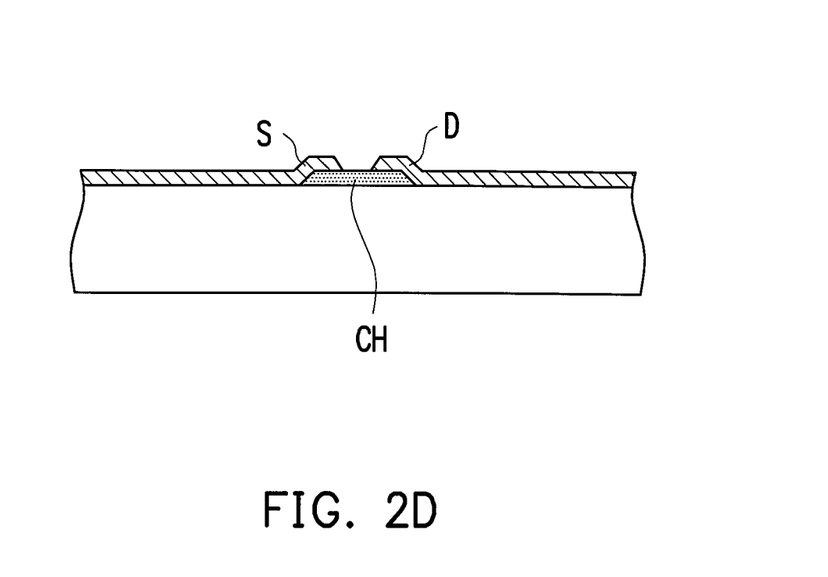

Referring to FIG. 2D, the metal layer 120 is then patterned to form a source S and a drain D. The source S and the drain D are separated from each other and electrically connected with two ends of the active layer CH respectively. For example, in the present embodiment, the metal layer 120 may be patterned by a wet etching process to form the source S and the drain D. It is to be mentioned that due to the active layer CH being formed by the crystallization process, the active layer CH has the crystalline elements. When the metal layer 120 is patterned by the wet etching process to form the source S and the drain D, the crystalline elements of the active layer CH may resist erosion by the etchant used in the wet etching process to prevent the active layer CH from being damaged. In this way, the metal layer 120 may be patterned by the wet etching process with short process time and low cost to form the source S and the drain D, and the quality of the finally formed active layer CH is also taken into consideration, such that a thin film transistor with good quality and low cost can be fabricated.

Figure 2E:
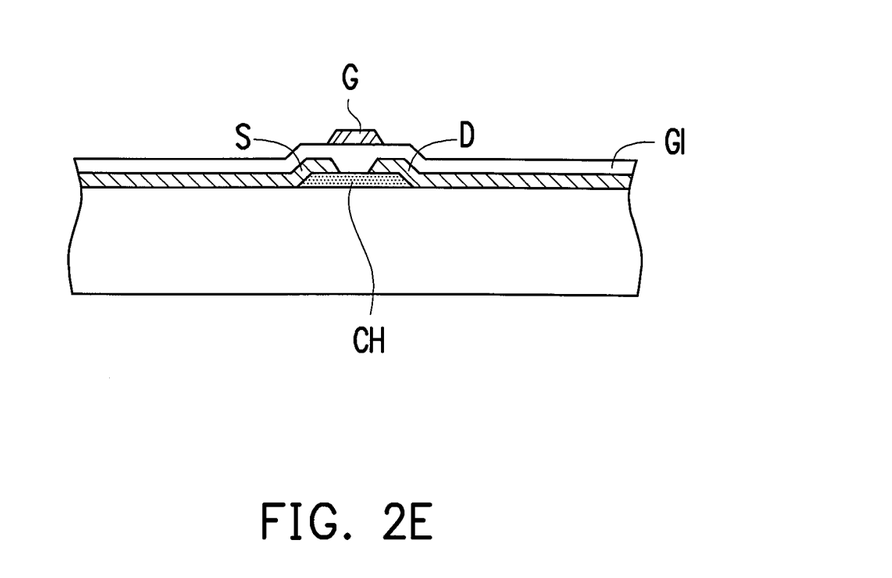

Referring to FIG. 2E, a gate insulator layer GI is formed. The gate insulator layer GI covers the source S, the drain D and a portion of the active layer CH exposed by the source S and the drain D. Then, a gate G is formed on the gate insulator layer GI. The gate insulator layer GI is disposed between the gate G and a group of the source S and the drain D. The gate G is separated from the source S and the drain D by using the gate insulator layer GI and overlaps with the active layer CH. Here, the thin film transistor of the present embodiment is completed.

Referring to FIG. 2E, in the present embodiment, the gate G is disposed on the active layer CH. Namely, the thin film transistor of the present embodiment may be a top gate thin film transistor (top gate TFT). However, the fabricating method of the thin film transistor is not limited to fabricating only the top gate TFT in the invention, and may also be applied to fabricate other types of TFT, which will be described with reference to FIG. 4A to FIG. 4D.

FIG. 4A to FIG. 4D are schematic cross-sectional views illustrating a method of fabricating a thin film transistor according to another embodiment of the invention. The fabricating method illustrated in FIG. 4A to FIG. 4D is similar to the fabricating method illustrated in FIG. 2A to FIG. 2E, and thus, the same or corresponding elements are labeled by the same or corresponding reference numerals. The fabricating method illustrated in FIG. 4A to FIG. 4D is different from that illustrated in FIG. 2A to FIG. 2E in different time points of forming the gate G and the gate insulator layer GI, and the difference will be described below, where the same parts may correspondingly refer to the related description above according to the reference numerals in FIG. 4A to FIG. 4D and thus, will not be repeatedly described.

Figure 4A:
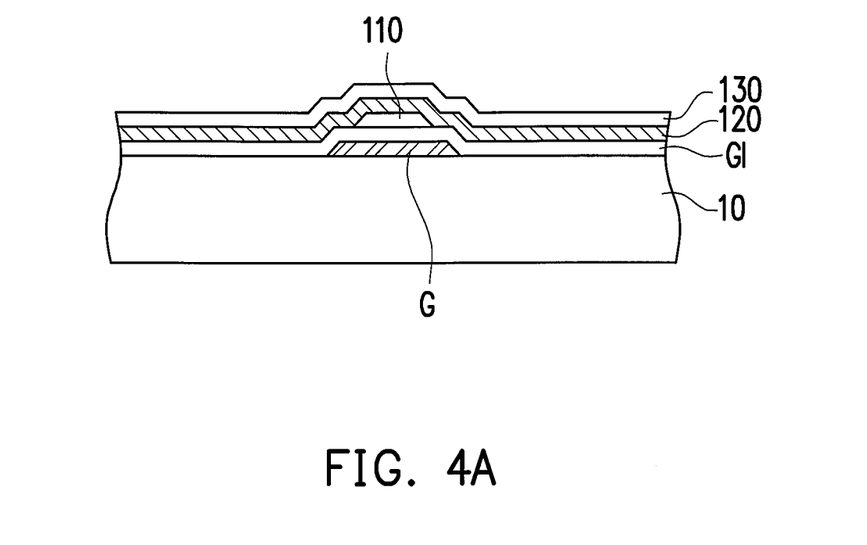
FIG. 4A to FIG. 4D are schematic cross-sectional views illustrating a method of fabricating a thin film transistor according to another embodiment of the invention.
Figure 4B:
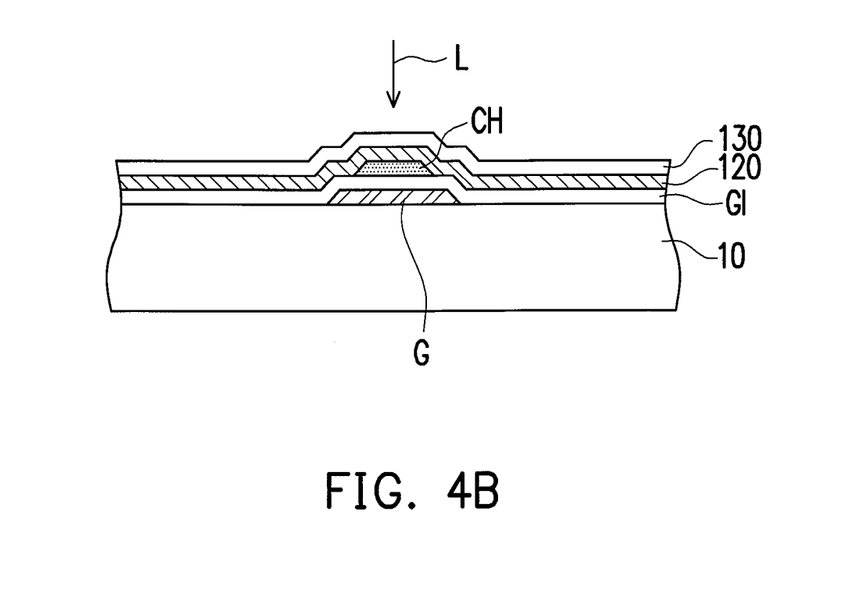
Figure 4C:
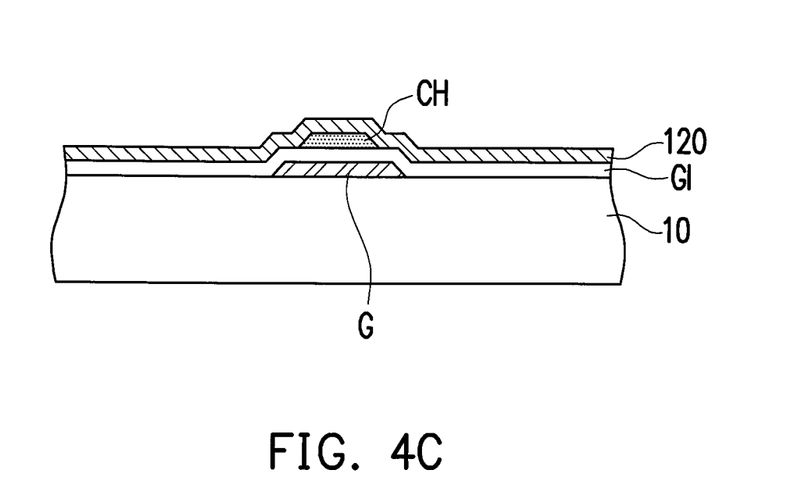
Figure 4D:
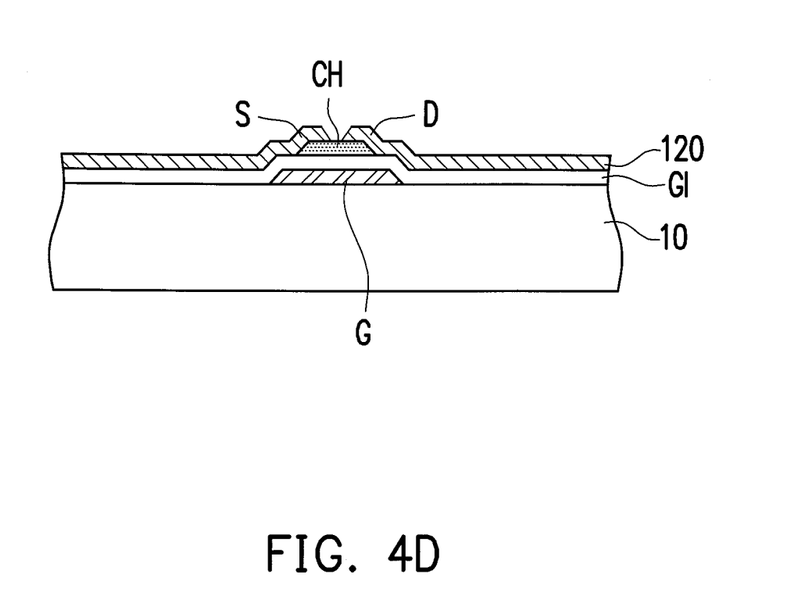

Referring to FIG. 4A, in the present embodiment, the gate G is first formed on the substrate 10, and the gate insulator layer GI is then formed on the gate G. Afterwards, the patterned semiconductor layer 110, metal layer 120 and auxiliary layer 130 are sequentially formed on the gate insulator layer GI, and the semiconductor layer 110 overlaps with the gate G. Referring to FIG. 4B, then, after the metal layer 120 and the auxiliary layer 130 are located on the semiconductor layer 110, the semiconductor layer 110 is transformed into the active layer CH by the crystallization process. Referring to FIG. 4C, the auxiliary layer 130 is then removed. Referring to FIG. 4D, the metal layer 120 is patterned to form the source S and the drain D, and thus, the thin film transistor is completed.

Referring to FIG. 4D, in the present embodiment, the gate G is disposed under the active layer CH. Namely, the thin film transistor of the present embodiment may be a bottom gate TFT. However, it should be mentioned that the fabricating method of the thin film transistor is not limited to fabricating only the top gate TFT and the bottom gate TFT in the invention, and may also be applied to fabricate other types of TFT (e.g., a dual-gate TFT). The persons with ordinary skill of the art shall implement other types of TFT by utilizing the method of fabricating the thin film transistor of the invention, and thus, will not be described one by one.

To summarize, in the method of fabricating the thin film transistor of one of the embodiments of the invention, the active layer having the crystalline elements is formed by the crystallization process before the metal layer is patterned to form the source and the drain. With etching resistance characteristics of the crystalline elements, the active layer can be prevented from being damaged by the etchant during the process of patterning the metal layer, such that the thin film transistor with high quality and low cost can be fabricated.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a thin film transistor, comprising:
    forming a semiconductor layer, a metal layer and an auxiliary layer on a substrate;
    performing a crystallization process to transform the semiconductor layer into an active layer after the metal layer and the auxiliary layer are disposed on the semiconductor layer;
    patterning the metal layer to form a source and a drain after the crystallization process;
    forming a gate; and
    forming a gate insulator layer, wherein the gate insulator layer is disposed between the gate and the source and drain.

2. The method according to claim 1, further comprising performing a dehydrogenation process on the auxiliary layer or the metal layer after the auxiliary layer is formed.

3. The method according to claim 1, wherein the auxiliary layer comprises amorphous silicon, polysilicon or monocrystalline silicon.

4. The method according to claim 1, wherein the crystallization process is performed by using excimer laser, infrared femtosecond laser or green laser.

5. The method according to claim 4, wherein energy of the excimer laser used in the excimer laser crystallization process is greater than 70 mJ/cm$^2$.

6. The method according to claim 1, wherein the metal layer comprises molybdenum (Mo), aluminum (Al), molybdenum wolfram (MoW) or copper wolfram (CuW).

7. The method according to claim 1, wherein the crystallization process is performed under a temperature ranging from about 0° C. to about 25° C.

8. The method according to claim 1, wherein the semiconductor layer comprises an indium-containing metal oxide semiconductor material, a zinc-containing metal oxide semiconductor material, or a gallium-containing metal oxide semiconductor material.

9. The method according to claim 1, further comprising removing the auxiliary layer.

10. The method according to claim 1, wherein the steps of forming the gate and forming the gate insulator layer are performed before the step of forming the semiconductor layer, the metal layer and the auxiliary layer.

11. The method according to claim 1, wherein the steps of forming the gate and forming the gate insulator layer are performed after the step of forming the semiconductor layer, the metal layer and the auxiliary layer, and the step of forming the gate is performed after the step of forming the gate insulator layer.

* * * * *